United States Patent [19]

Uritsky et al.

[11] Patent Number: 5,381,004
[45] Date of Patent: Jan. 10, 1995

[54] PARTICLE ANALYSIS OF NOTCHED WAFERS

[75] Inventors: Yuri S. Uritsky, Foster City; Harry Q. Lee, Mountain View, both of Calif.

[73] Assignee: Applied Materials, Inc., Santa Clara, Calif.

[21] Appl. No.: 115,482

[22] Filed: Aug. 31, 1993

[51] Int. Cl.$^6$ .................... H01J 37/26; G01B 11/00
[52] U.S. Cl. .................................... 250/307; 356/375
[58] Field of Search .................... 250/307; 356/375

[56] References Cited

U.S. PATENT DOCUMENTS

| | | | |
|---|---|---|---|
| 4,037,941 | 7/1977 | Belleson et al. | 356/429 |
| 4,611,292 | 9/1986 | Ninomiya et al. | 356/376 |
| 4,659,220 | 4/1987 | Bronte et al. | 356/237 |
| 4,878,247 | 10/1989 | Wester-Ebbinghaus | 356/395 |
| 4,900,695 | 2/1990 | Takahashi et al. | 437/195 |
| 5,267,017 | 11/1993 | Uritsky et al. | 356/375 |

OTHER PUBLICATIONS

Press, et al., *Numerical Recipes In C,* "General Linear Least Squares," 1992, pp. 671-675.

*Primary Examiner*—Bruce C. Anderson
*Attorney, Agent, or Firm*—Suzanne R. Jones

[57] ABSTRACT

A method for reducing targeting errors that arise when trying to locate contaminant particles on a notched semiconductor wafer using a high-magnification imaging device, based on estimates of wafer feature positions obtained from a scanning device. The present invention scans a notched semiconductor wafer with a scanning device to obtain scanning device coordinates for the positions of: (i) the wafer center; (ii) the wafer notch; and (iii) contaminant particles on the wafer. Next, the present invention finds the wafer notch and wafer center with an imaging device and obtains their estimated imaging device coordinates. Subsequently, the present invention calculates estimated transformation parameters for a coordinate transformation between the coordinate systems of the scanning device and the imaging device based on the scamping device coordinates and the estimated imaging device coordinates of the wafer notch and the wafer center. Finally, the present invention transforms the scanning device coordinates of the particles on the wafer to estimated imaging device coordinates using the estimated transformation parameters.

21 Claims, 6 Drawing Sheets

PARTICLE ANALYSIS OF NOTCHED WAFERS

BACKGROUND OF THE INVENTION

1. Field Of The Invention

This invention relates generally to techniques for the identification and analysis of contaminant particles on semiconductor wafers and, more particularly, to techniques for locating particles on notched wafers when using a high-magnification imaging device.

2. Description Of The Related Art

Semiconductor fabrication technology today deals with wafer sizes up to 200 mm (millimeters) and feature geometries with dimensions well below 1 $\mu$m (micrometer). The presence of a contaminant particle larger than half the width of a conductive line on a wafer can lead to failure of a semiconductor chip made from the wafer. Therefore, a critical task facing semiconductor process engineers is to identify and, as far as possible, to eliminate sources of surface contamination.

Particle analysis on notched silicon wafers consists of locating contaminant particles on a wafer surface and analyzing their chemical compositions to determine the source of contamination. A well-known approach is to use a scanning electron microscope (SEM) in conjunction with analysis tool such as X-ray spectroscopy to respectively locate and analyze the particles. Because common particle dimensions are on the order of 0.1–1 $\mu$m, however, initial magnifications on the order of 200 times to 2000 times are required for the particle to be seen on the SEM screen. At these high levels of magnification, only a small portion of the wafer is visible on the SEM screen at the same time, and, therefore, particle positions must be known quite accurately before the SEM can be used.

Because the SEM must be operated at high levels of magnification, it is not a useful instrument to obtain an overview of particles on an entire wafer. Other devices have been developed for this purpose and a two-stage process for locating and analyzing particles is generally employed. In the first stage, a laser scanning device raster-scans the wafer with a laser beam to locate most of the particles on the wafer. An example of such a device is a Tencor SurfScan 5000, manufactured by Tencor Instruments. The laser scanner then creates a laser scan map of the coordinates of the wafer features and contaminant particles. The manner in which the laser beam is scattered from the wafer features and the particles yields signals from which estimated particle positions in terms of x and y coordinates can be determined. However, because the scattering mechanism is not completely understood, the signals are of little help in identifying the type, chemical composition, and possible source of contaminant particles. This information can only be obtained with the help of a high-magnification imaging device, such as an SEM.

A critical aspect of this two-stage particle analysis method is that the coordinate system used in the laser scanning device must be transformed to the coordinate system used in the SEM or other similar imaging device. The notched wafer is physically moved from one device to the other, and there is no way to guarantee that the coordinate system used in the laser scanning device will still apply when the wafer is moved to the SEM. The wafer may be rotated inadvertently when it is moved from one device to the other, and the origins or zero reference points of the two coordinate systems will, in general, not be identical. Therefore, the particle coordinates obtained from the laser scanning device must be transformed to corresponding coordinates used in the SEM.

In the past, this transformation was accomplished by identifying, in both devices, two reference contaminant particles that are relatively recognizable due to their size and contrast. Given the coordinates of these two reference contaminant particles, as measured in the coordinate systems of both devices, a simple and well known coordinate transformation can be used to transform the remaining particle coordinates from one coordinate system to the other. See, for example, commonly assigned U.S. patent application, Ser. No. 07/886,541 to Uritsky et al. In general, transformation between two coordinate systems can be completely defined by an offset value and a rotation angle. That is to say, the transformation from one coordinate system to another can be considered to include a linear movement of the x and y axes so that the new origin assumes a position displaced from the old origin, together with a rotation of the axes about the origin to a new angular orientation. Such coordinate transformations are well known, and simple equations for performing them may be found in almost any basic text on linear algebra, coordinate geometry, or related subject matter. For example, transformations are completely defined in a text by John J. Craig entitled "Introduction to Robotics: Mechanics and Control," 2nd edition, published by Addison-Wesley Publishing Company, Inc. (1989), and specifically on pages 25–30. The transformation equations can also be found in "Elementary Linear Algebra," by Howard Anton, pp. 229–30, published by Anton textbooks, Inc. (1987).

Notched eight-inch (200 mm) wafers pose a particular challenge to the coordinate transformation problem due to their large size and limited reference marks. In general, the notch in notched eight inch wafers is only 1 mm $\times$ 1 mm, or only 0.5% of the length of the 200 mm wafer diameter. Although a notch is typically a triangular indent in the circular wafer edge and having a rounded point, other types of indents and indented patterns are included within the meaning of the term. Flatted wafers are generally easier to analyze than notched wafers because the flat wafer includes a convenient and relatively long reference line with respect to which the wafer can be oriented. In the case of the notched eight inch wafer, however, there is no such reference line.

Several analysis methods which can facilitate the coordinate transformation for notched wafers have been previously considered. One solution is to set up the coordinate system of the Slim to be identical to that of the laser scanning device. Although this method appears feasible in theory, it is difficult and costly to implement in practice. Some form of precision mechanical fixture is necessary to hold the wafer in precisely the same orientation in both coordinate systems. Unfortunately, attempts to orient the notched wafer identically in both the SEM and the laser scanning device are prone to rotational error. Moreover, due to the large diameter of the notched wafer, a one degree error in orientation will result in a 1,700 $\mu$m error (Error=$r\theta$) for locating particles near the wafer edge.

A second approach is to orient the wafer such that the area near the notch is easily located in the SEM screen. The operator can then locate two reference particles near the notch that correspond to two particles on the laser scan map. Knowing the coordinates of the reference particles in both the SEM and laser scanning coordinate systems, a transformation can be applied to the laser scanned particle coordinates to yield SEM coordinates. However, particles may not always be present near the notch. Moreover, even if marks were physically generated near the notch, a difficulty tends to arise with the coordinate transformation itself since using two closely spaced points to compute the coordinate transformation can result in significant round-off error.

A final approach is to physically create known reference marks on the wafer surface, or to have known reference marks on the wafer prior to processing. However, to accurately define the transformation between coordinate system, the reference marks must be placed relatively far apart. Then, to find these marks using the SEM, a mechanical fixture would again be necessary to provide an accurate initial orientation. In addition, user generated marks damage the wafer and can cause additional contaminant particles to be generated.

From the foregoing discussion, it can be appreciated that there is a need for an improved method for transforming the coordinates of the laser scanning device to the coordinates of the SEM to accurately locate contaminant particles on an eight inch notched wafer. The present invention fulfills this need.

SUMMARY OF THE INVENTION

The present invention resides in a method for reducing targeting errors that arise when trying to locate contaminant particles on a notched wafer using a high-magnification imaging device, based on estimates of the positions of the intersection point of the notch and the center of the wafer obtained frown a scanning device. The invention utilizes two repeatable and accurate reference marks, namely the wafer notch and the wafer center, common to both the laser scanning device and the SEM.

More particularly, the method of the present invention includes scanning a notched semiconductor wafer with a laser scanning device to obtain scanning device coordinates for the positions of: (i) the center of the wafer; (ii) the wafer notch; and (iii) contaminant particles on the wafer. The estimated imaging device coordinates of the wafer notch and the wafer center are then located with an imaging device. Estimated transformation parameters for a coordinate transformation between the coordinate systems of the scanning device and the imaging device are calculated based on the scanning device coordinates and the estimated imaging device coordinates of the wafer notch and the wafer center. Lastly, the scanning device coordinates of the particles on the wafer are transformed to estimated imaging device coordinates using the estimated transformation parameters.

In a further aspect of the invention, the method of the present invention also includes locating two reference particles with an imaging device by using their estimated imaging device coordinates and obtaining their actual imaging device coordinates. Then, actual transformation parameters are calculated for a coordinate transformation between the coordinate systems of the scanning device and the imaging device based on the scanning device coordinates and the actual imaging device coordinates of the reference particles. Finally, the scanning device coordinates of the remaining particles on the wafer are transformed to imaging device coordinates using the actual transformation parameters.

The basic analysis method of the present invention has been successful in targeting reference particles on eight inch notched wafers to within about 100–150 $\mu$m, repeatably. Once two particles are located, further coordinate transformations between the laser scanning device and the SEM can be applied to reduce the targeting error to approximately 40–50 $\mu$m in a region of interest.

Additional accuracy can be obtained by maintaining a record of the coordinate transformation parameters used in previously processed wafers. By accumulating the errors in the coordinate transformation parameters of previously processed wafers, the accuracy of the wafer currently being processed can be improved. Accumulated errors in coordinate transformation parameters, averaged over a predetermined number of most recently processed wafers, are applied to the estimated transformation parameters before the initial transformation. The rationale is to eliminate or reduce as much as possible any positioning error due to some repeatable factor, such as a consistent operator error or a nearly constant offset in the laser scanning device or SEM. These revised transformation parameters are then used for the initial transformation.

It will be appreciated from the foregoing that the present invention represents a significant advance over prior techniques for locating and analyzing contaminant particles on the surface of a notched semiconductor wafer. Other aspects and advantages of the invention will become apparent from the following more detailed description, taken in conjunction with the accompanying drawings.

DETAILED DESCRIPTION OF THE PREFERRED METHOD

Figure 1A:
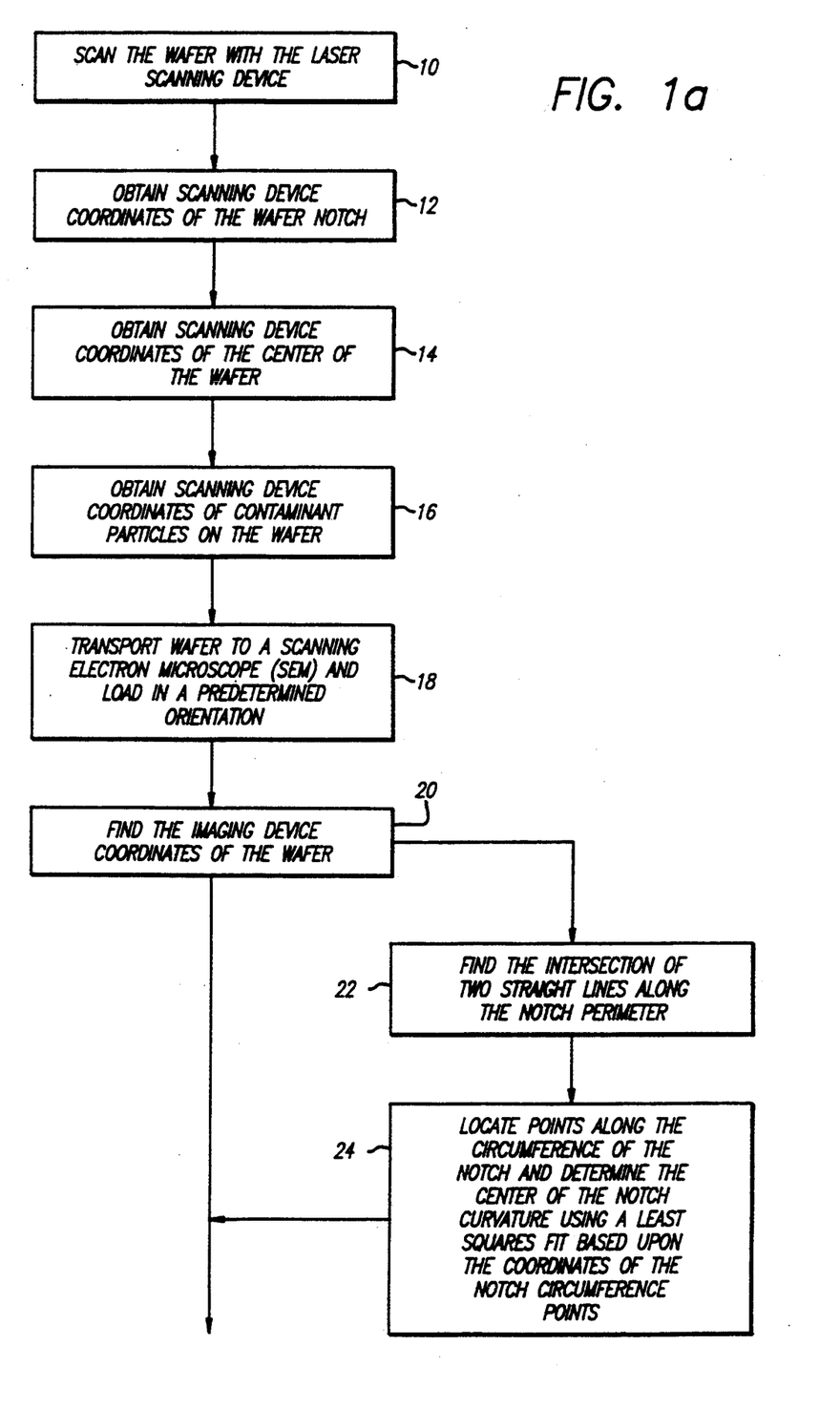
FIGS. 1a, 1b and 1c are simplified flowcharts of the steps performed to locate particles on a notched wafer.
Figure 1B:
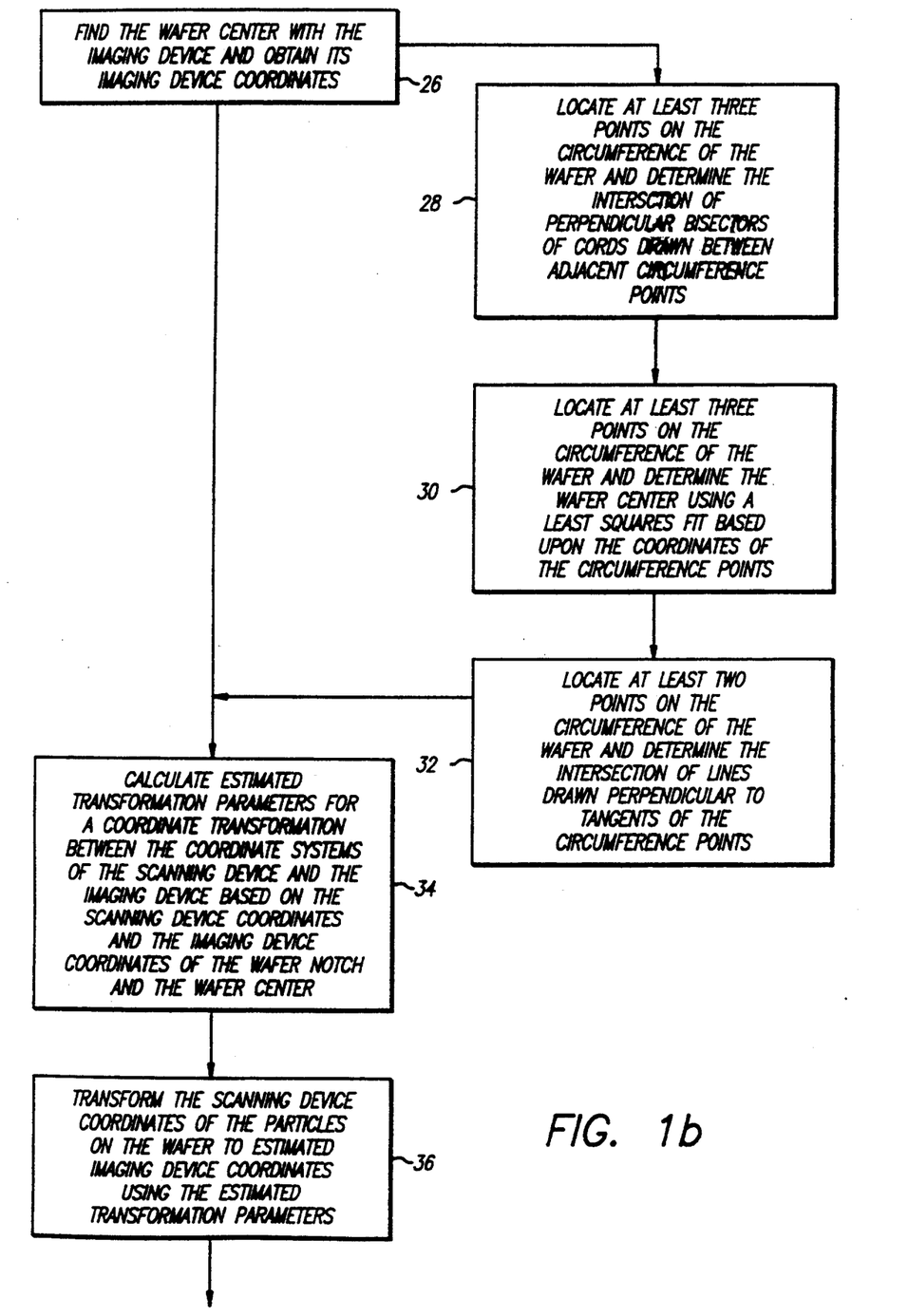
Figure 1C:
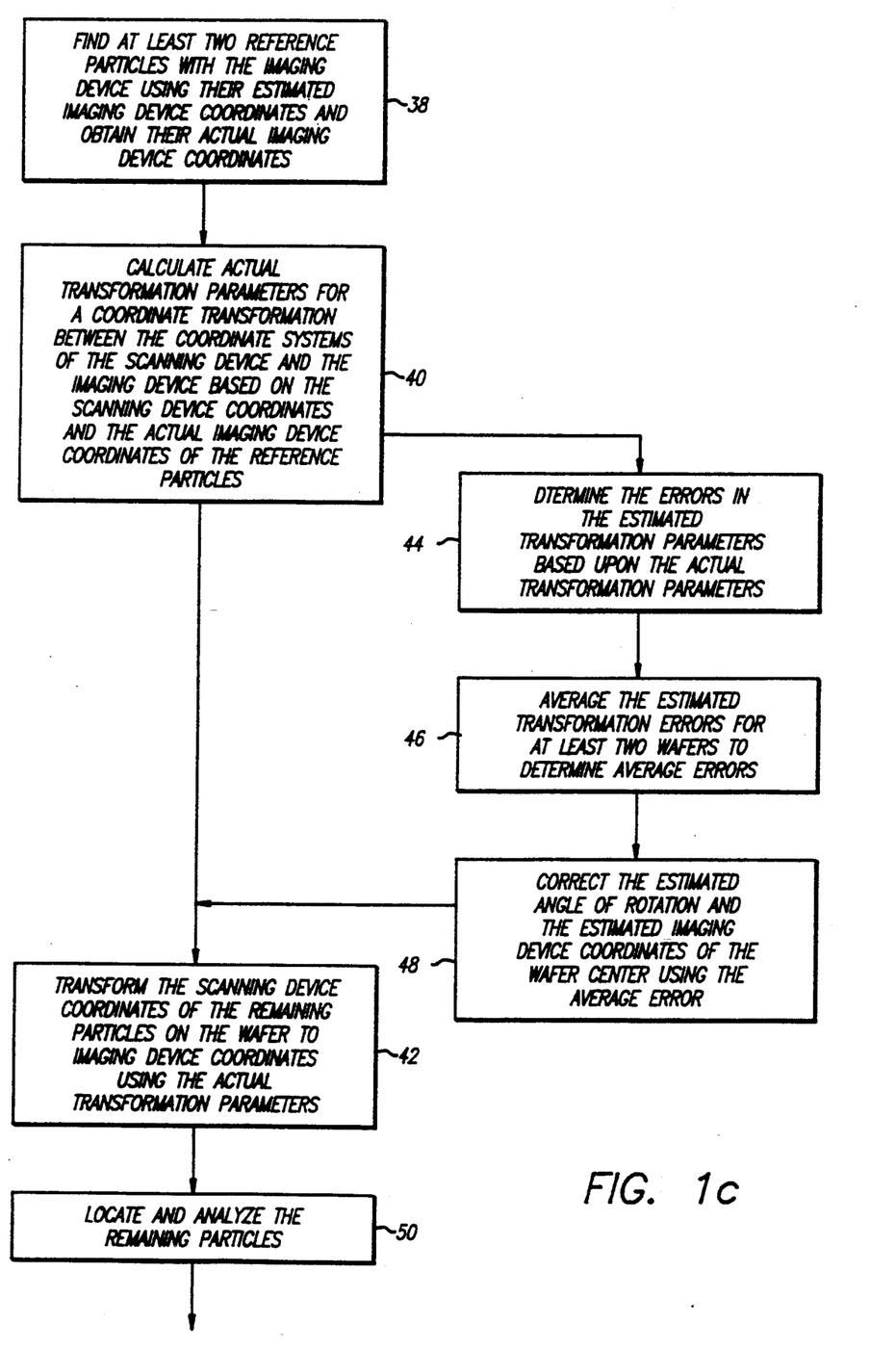

With reference to the drawings, and particularly to FIG. 1, there is shown a flow chart of the steps performed to locate particles on a notched wafer. The present invention provides an improved technique for locating contaminant particles on a notched semiconductor wafer by significantly reducing targeting error values. That is to say, the method of the invention predicts particle positions more accurately and, therefore, locates more particles when using an imaging device, such as a scanning electron microscope (SEM).

As mentioned above, semiconductor feature sizes below the 1 μm level and large wafer sizes make it difficult to locate and identify all of the contaminant particles on a notched wafer. The present invention incorporates a two-stage technique, first using a laser scanning device to map approximately the entire wafer and to provide an estimate of the locations of particles on the wafer surface. Then, the wafer is moved to a scanning electron microscope (SEM) or similar high-magnification imaging device. The coordinates of the particle positions are transformed from the coordinate system of the laser scanning device to the coordinate system of the SEM, using the wafer center and the wafer notch, which can be readily identified in both devices because of their position and unique characteristics.

An analysis of a notched wafer begins with step 10 during which the wafer is scanned by a laser scanning device. In the preferred method of the invention, the notch of every wafer is placed in the same orientation in the specimen holder of the laser scamping device to reduce random errors. The selected orientation is based upon a prior series of experiments to determine which position yields the highest accuracy in terms of accuracy of targeting the notch position. In the preferred method, the wafer is placed in the specimen holder with the notch in the four o'clock position, e.g., with the notch rotated 120 degrees from the vertical axis, which may be treated as a predetermined axis. However, the optimal notch orientation can vary between laser scanning devices and should be determined for each device. Of course, the selected orientation of the wafer in the specimen holder can change to any orientation without departing from the invention.

To establish the laser scan map of the features and contaminant particles on a notched wafer with the laser scanning device, in steps 12 and 14 the scanning device coordinates of the wafer notch and center are determined. Initially, in the preferred method, the laser scanning device scans the wafer and the locations of the wafer notch and center are determined based upon the scattered light signal produced by the interaction of the laser beam and the edge of the wafer. The location of the notch is determined by locating the edge point closest to the wafer center. The location of the center is determined by constructing perpendiculars to the tangents of two circumference points and finding their intersection.

Figure 4:
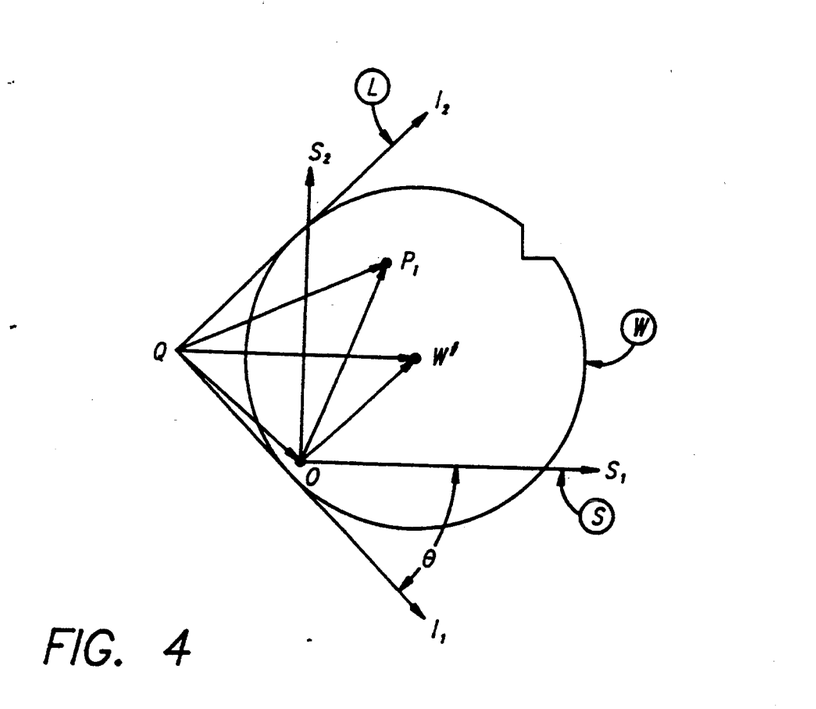
FIG. 4 is a diagrammatic view of a wafer and the coordinate reference frames of the laser scanning device and the SEM showing the method for calculating estimated transformation parameters for a coordinate transformation between the laser scanning device and the SEM coordinate systems.

Next, also in the preferred method, the laser scanning device establishes its coordinate system such that the tip of the wafer notch is in the 12 o'clock position and the wafer center location is assigned the laser scanning device coordinates of $x=100$ and $y=100$. The y-axis is established tangent to the left edge of the wafer and the x-axis is established perpendicular to the y-axis and tangent to the bottom edge of the wafer edge as shown in FIG. 4. Accordingly, the point on the edge of the wafer opposite the notch point (the bottom edge point in the laser scanning reference frame) is assigned the coordinates of $x=100$, $y=0$. Similarly, the furthest horizontal edge points are assigned the coordinates of $x=0$, $y=100$, and $x=200$, $y=100$. Thus, in the preferred method, the laser scanning device coordinates of the water center are $x=100$ and $y=100$. While the laser scanning device coordinates of the wafer notch are $x=100$, and $y=(200\text{-depth of notch from wafer edge})$. While these specific coordinates are included for the purposes of disclosing the presently preferred method, the coordinate system of the laser scanning device can be established in any orientation with respect to the wafer notch and edges without departing from the present invention.

Once the reference frame of the laser scanning device is established, in step 16 the scanning device coordinates of the contaminant particles on the wafer are determined.

Unfortunately, the laser scanning device method of establishing a coordinate system creates repeatability problems. First, when using current technology, while all the wafer edge points are scanned by the laser scanner, only one of every twelve samples is retained for computation. This is done to reduce data storage requirements. The notch is determined by locating the point closest to the center; however, because the notch is only 1 mm by 1 mm in an eight inch notched wafer, there is a high probability that on successive scans, the one in twelve sampling criteria will result in different notch point coordinates each time. Second, the same type of problem arises in the determination of the center of the wafer by the laser scanning device. Current laser scanners use only two tangent points rather than a least squares fit of several circumference points to determine the wafer center, and this can lead to difficulties in repeatably determining the center scanning device coordinates.

Based upon a principle that x-y coordinates of any point detected within an SEM screen can be precisely determined, the present invention, given the repeatability errors of the laser scanning device, can accurately and repeatably establish the SEM coordinate system such that the errors involved in the coordinate transformation from the laser scanning device to the SEM can decrease by approximately a factor of 2.

In the next step 18, the wafer is transported to a scanning electron microscope (SEM) where it is loaded in the SEM chamber in a predetermined orientation; for example, in the preferred method, the notch point will always be placed at an angle of 45 degrees from the vertical axis. The orientation is based primarily on the ease with which the operator can locate the notch in the SEM screen. Furthermore, the positioning of the notch in a predetermined orientation is more important when using SEMs that do not display the entire wafer in their screens. If the field of view for the SEM is such that the entire wafer can be displayed, the notch can be oriented anywhere and still be located easily with the SEM.

Initially, to improve the transformation from the laser scanning coordinate system to the SEM coordinate system, the present invention establishes the SEM coordinate system using, as near as possible, the same points used by the laser scanning system in establishing its coordinate system. These points are the center and the notch of the wafer. Because variations exist in the coordinates of these points in the laser scanning system, the present invention seeks to determine as accurately and repeatably as possible, the coordinates of these points in the SEM system so that the coordinate transformation is repeatable.

Figure 2A:
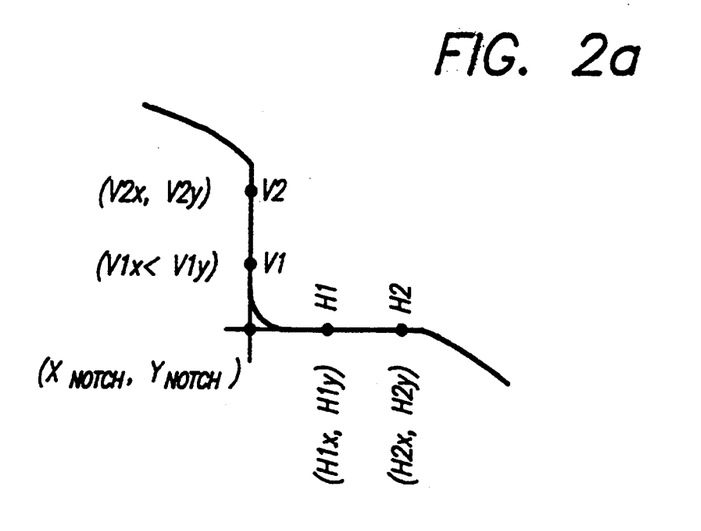
FIG. 2a is a diagrammatic view of a notch of a wafer illustrating a method of determining the estimated imaging device coordinates of the notch based upon the intersection of two straight lines along the notch edge.

Once the wafer is loaded in the SEM, in step 20 estimated imaging device coordinates of the notch are determined. In the preferred method, to accurately determine the estimated imaging device coordinates of the notch point, the coordinates of two points are averaged. First, in step 22, the estimated imaging device coordinates of the notch point, $x_{notch}$ and $y_{notch}$, are determined by finding the intersection of two straight lines along the notch perimeter. Determining $x_{notch}$ and $y_{notch}$ requires locating four points near the notch as shown in FIG. 2a. The points V1, V2, H1, and H2 are located with the SEM. The intersection of the line formed by points V1 and V2 with the line formed by points H1 and H2 determines the estimated imaging device coordinates of the notch point.

In particular, the line formed by points V1 and V2 is given by:

$$y = m_v x + b_v \tag{1}$$

where $$m_v = \frac{V1y - V2y}{V1x - V2x} \tag{2}$$

and $$b_v = V1y - m_v(V1x) \tag{3}$$

Where V1x, V1y, V2x and V2y are the x and y imaging device coordinates of the points V1 and V2, respectively. Similarly, the line formed by points H1 and H2 is given by $$y = m_h x + b_h \tag{4}$$

where $$m_h = \frac{H1y - H2y}{H1x - H2x} \tag{5}$$

and $$b_h = H1y - m_h(H1x) \tag{6}$$

Where H1x, H1y, H2x and H2y are the x and y imaging device coordinates of the points H1 and H2, respectively.

Intersecting the lines defined by Equations (1) and (4) yields the solution for the notch point:

$$x_{notch} = \frac{b_v - b_h}{m_h - m_v} \tag{7}$$

$$y_{notch} = m_h x_{notch} + b_h \tag{8}$$

Figure 2B:
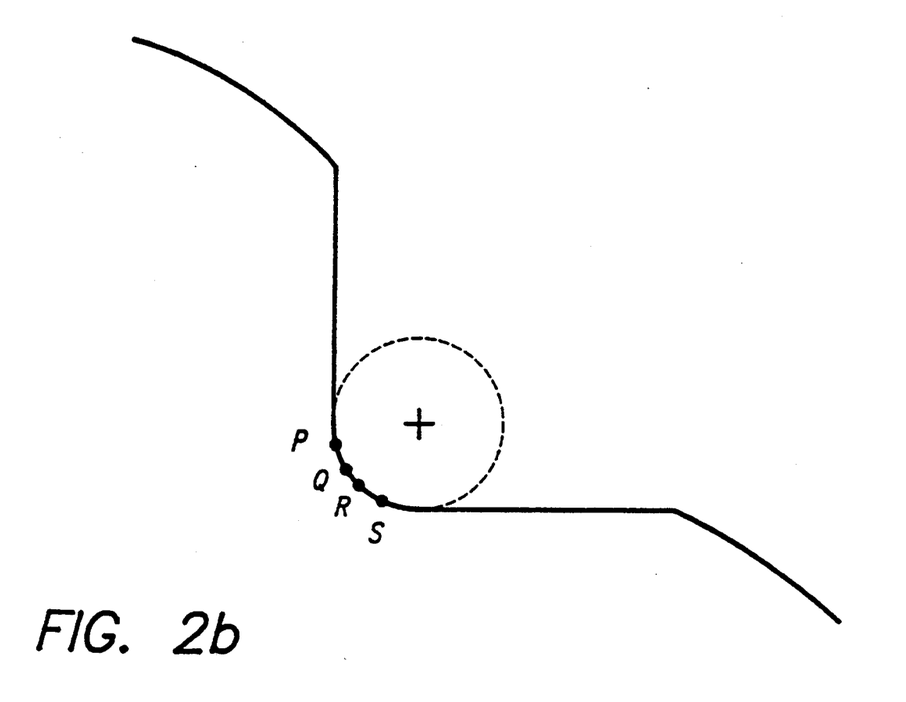
FIG. 2b is a diagrammatic view of a notch of a wafer illustrating a method of determining the estimated imaging device coordinates of the center of the notch curvature based upon a least squares fit analysis of four points along the notch edge.

An alternative method of determining the estimated imaging device coordinates of the notch is shown in FIG. 2b. In step 24, the imaging device coordinates of the center of curvature of the notch curve is determined by a least squares fit of the imaging device coordinates of four points located on the notch curve. Determinations of least squares fit to ascertain the estimated imaging device coordinates of the center and radius of a circle are well known, and the simple equations for performing it may be found in a text by D. Kahaner, et al., entitled "Numerical Methods And Software," published by Prentice Hall (1989). For wafers with notch profiles that are difficult to resolve, the notch estimated imaging device coordinates obtained by the two methods shown in FIGS. 2a and 2b are averaged.

The angle $\theta$, the angle of rotation between the imaging device and the laser scanning device reference frames, can be determined by Equation (33), discussed below, after the notch point estimated imaging device coordinates are determined. For additional accuracy in processing of wafers, $\theta$ can be calculated using both notch location methods and then averaged to provide a more accurate determination of the notch orientation.

Next, in step 26 the estimated imaging device coordinates of the center of the wafer are determined. In step 28 the imaging device coordinates of four points along its circumference are determined under high magnification and a least squares fit determination of the wafer center is performed. This method of analysis can be accurately and repeatably performed using the SEM to minimize the variations in the coordinate system of the SEM. The least squares fit determination can be performed using a minimum of three points on the circumference of the wafer. When greater than three points are used, the estimated imaging device coordinates of the wafer center are determined by averaging the center coordinates determined by each unique set of three points, or by applying a linear least squares fit to the points.

Figure 3:
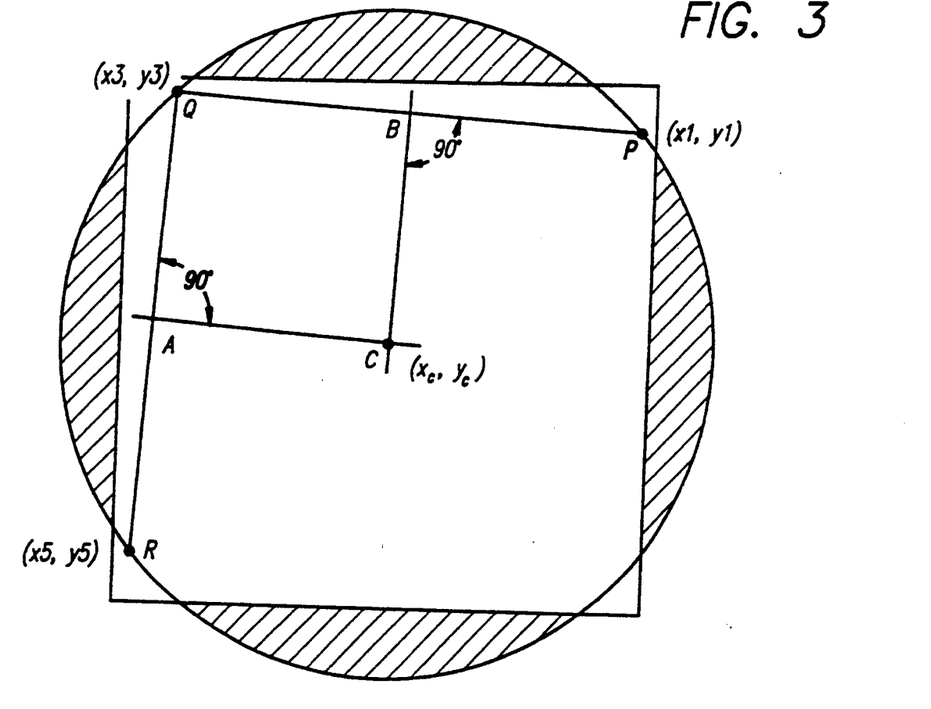
FIG. 3 is a diagrammatic view of a wafer illustrating a method of determining the estimated imaging device coordinates of the center of wafer by determining the intersection of perpendicular bisectors of chords drawn between adjacent points along the wafer circumference.

In step 30, the preferred method of determining the estimated imaging device coordinates of the wafer center includes finding a minimum of three points (P, Q and R) located on the wafer edge as shown in FIG. 3. Chords are drawn using these three points and the estimated imaging device coordinates of the center are determined by the intersection of the perpendicular bisectors to the chords. The equations for these determinations are as follows:

Line RQ is given by $$y = m_{RQ} x + b_{RQ} \tag{9}$$

where $$m_{RQ} = \frac{y3 - y5}{x3 - x4} \tag{10}$$

and $$b_{RQ} = y3 - m_{RQ}(x3) \tag{11}$$

The line QP is similarly derived and is given by $$y = m_{QP} x + b_{QP} \tag{12}$$

Next, the perpendicular bisector AC is given by $$y = m_{AC} x + b_{AC} \tag{13}$$

where $$m_{AC} = \frac{1}{m_{RQ}} \tag{14}$$

$$b_{AC} = y_A - m_{AC}(x_A) \tag{15}$$

$$x_A = \frac{x3 + x5}{2} \tag{16}$$

and $$y_A = \frac{y3 + y5}{2} \tag{17}$$

Similarly, the perpendicular bisector BC is given by $$y = m_{BC}x + b_{BC} \tag{18}$$

$$y = m_{BC}x + b_{BC} \tag{18}$$

The underlying equations for the bisector BC are similar to the underlying equations for the bisector AC, and for the sake of brevity, are omitted.

Intersecting the lines defined by Equations (13) and (18) yields the solution for the center point, and accordingly the estimated imaging device coordinates of the wafer center:

$$x_C = \frac{b_{BC} - b_{AC}}{m_{AC} - m_{BC}} \tag{19}$$

$$y_c = m_{AC}x_c + b_{AC} \tag{20}$$

By using 4 edge points (P, Q, R, S), 4 combinations of three points may be used (P-Q-R, Q-R-S, R-S-P, S-P-Q), and the imaging device coordinates of an average center position can be computed. These coordinates are then used as the estimated imaging device coordinates of the wafer center. Only edge points that are sufficiently far from one another should be considered.

Alternatively, in step 32 the estimated imaging device coordinates of the wafer center can be determined by constructing perpendiculars to the tangents of two circumference points and finding their intersection. Finally, the three methods for determining the wafer center coordinates can all be used and the results averaged to determine the estimated imaging device coordinates of the wafer center.

Generating coordinate transformation parameters using the wafer center and notch provides the following advantages. First, there is no longer a need for a precision mechanical fixture. The wafer can be arbitrarily oriented in the SEM coordinate system as long as the notch of the wafer can be readily located in the Sem screen. In the preferred method, every wafer is oriented in the same direction to eliminate random errors. The center point can be very accurately determined regardless of orientation by locating points on the circumference of the wafer.

Second, the wafer notch and the wafer center are far apart from each other. At approximately half the diameter of the wafer, the distance between the notch and the center, is large enough such that the resulting coordinate transformation is not affected by angular and round-off errors associated with reference points that are too close together. Third, the wafer notch and the wafer center can be accurately located with the SEM. The notch of the wafer can be positioned in a region of the SEM stage which makes locating the notch repeatable. The center can be determined by a least squares fit determination based upon the coordinates of circumference points of the wafer. Finally, no additional reference marks need to be generated on the wafer. The wafer surface is not disturbed and no additional contaminant particles are generated.

In step 34, estimated coordinate transformation parameters are computed. Two parameters are required to completely describe a two-dimensional transformation between coordinate systems: a translational vector and an angle of rotation $\theta$. Using the estimated imaging device coordinates of the wafer center and notch, estimated transformation parameters may be computed. There are two reasons why transformation parameters computed from the center and notch are estimated. First, the notch and the center are not always precisely located by the laser scanning device, as described above. Second, it may have been presumed that the center is located at x=100, y=100 and that the notch is located directly above the center in the laser scanning reference frame.

FIG. 4 shows the geometry of the coordinate transformation problem. The notched wafer is represented by reference frame W. The laser scanning device coordinate system and the imaging device, or SEM, coordinate system are represented by reference frames L and S, respectively. Unit vectors $l_1$ and $l_2$ and $s_1$ and $s_2$ define the axes for the L and S reference frames. These axes may be the axes along which either the laser imaging device raster scans or the specimen stage of the SEM is controllably translated. The origins of the L and S reference frames are marked by points Q and O. The center of the wafer is indicated by the point W*; a generic particle on the wafer surface is indicated by the point $P_i$.

The following notation is used in the following equations:

$p^{QP_i}$: Position vector from point Q to $P_i$. This vector is expressed in frame L.

$p^{QO}$: Position vector from point Q to point O.

$p^{OP_i}$: Position vector from point O to a generic particle at point $P_i$.

$p^{OW*}$: Position vector from point O to the wafer center W*.

$p^{QW*}$: Position vector from point Q to the wafer center W*.

$\theta$: The angle of rotation between reference frame L and S.

LSx and LSy: x and y-coordinates of a particle as determined by the laser scanner, also denoted as LSP1x, LSP1y, LSP2x, LSP2y.

$(x_c, y_c)$: The estimated imaging device coordinates of the center of the wafer.

SEMx: An equation for transforming scanning device x-coordinates to actual image device x-coordinates.

SEMy: An equation for transforming scanning device y- coordinates to actual image device y-coordinates.

SEMP1x: The actual image device x-coordinate of a particle P1.

SEMP1y: The actual image device y-coordinate of a particle P1.

$100_x$: An assigned laser scanning x-coordinate for the wafer center.

$100_y$: An assigned laser scanning y-coordinate for the wafer center.

The following information is known:

$p^{QP_i}$: The laser scanning coordinates of a generic particle $P_i$.

$p^{QW*}$: The laser scanning coordinates of the wafer center W*.

The desired result of the method of the present invention is to determine the actual imaging device coordinates of a generic particle $P_i$, designated by the position vector $p^{OPi}$ in the following equations. The desired position vector $p^{OPi}$ can be obtained by using vector arithmetic. Referring to FIG. 4, $p^{OPi}$ may be expressed as $$p^{OPi} = p^{QPi} - p^{QO} \tag{21}$$

At first, $p^{OPi}$ is defined in terms of the laser scanning coordinates of the particle $P_i$. It may be written as $$p^{QPi} = LSx l_1 + LSy l_2 \tag{22}$$

where LSx and LSy are the particle's x and y-coordinates as determined by the laser scanner. The position vector $p^{QO}$ is the translation vector between the laser scanner and the imaging device reference frames. It may be determined as follows $$p^{QO} = p^{QW*} - p^{OW*} \tag{23}$$

Assuming that the laser scanner locates the center of the wafer with perfect accuracy at the coordinates $x=100$ anti $y=100$ (an error source), the position vector $p^{Qw*}$ is given by $$p^{QW*} = 100 l_1 + 100 l_2 \tag{24}$$

Once the estimated imaging device coordinates of the wafer center have been determined, the position vector $p^{OW*}$ is given by $$p^{OW} = x_c s_1 + y_c s_2 \tag{25}$$

where ($x_c$, $y_c$) are the estimated imaging device coordinates of the center of the wafer. Substituting Equations (24) and (25) into (23) yields an expression for the translation vector $p^{QO}$ $$p^{QO} = 100 l_1 + 100 l_2 - (x_c s_1 + y_c s_2) \tag{26}$$

Substitution of Equation (26) and Equation (22) into Equation (21) yields an expression for $p^{OPi}$ $$p^{OPi} = (LSx - 100) l_1 + (LSy - 100) l_2 + x_c s_1 + y_c s_2 \tag{27}$$

Figure 5:
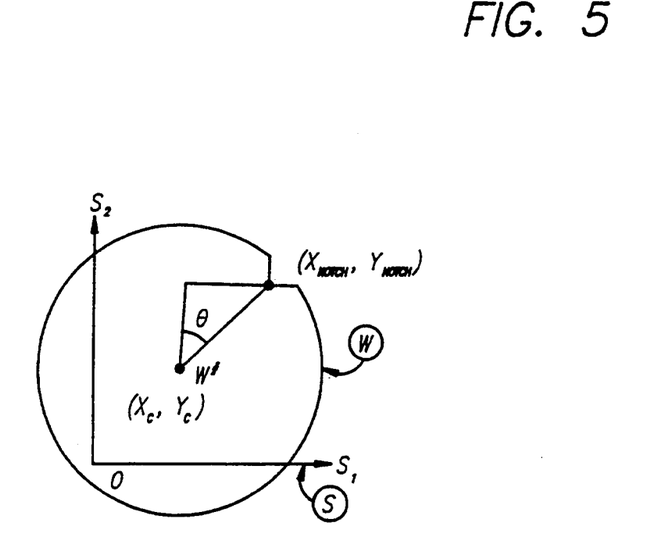
FIG. 5 is a diagrammatic view of a wafer showing the method for determining the angle of rotation between reference frames of the laser scanning device and the imaging device.

To express the position of particle $P_i$ in imaging device coordinates requires the replacement of the unit vectors $l_1$ and $l_2$ in Equation (27) with their equivalents in reference frame S. That is, $$l_1 = \cos(\theta) s_1 - \sin(\theta) s_2 \tag{28}$$

$$l_2 = \sin(\theta) s_1 + \cos(\theta) s_2 \tag{29}$$

where $\theta$ is the angle of rotation between reference frames L and S as shown in FIG. 5 and described in further detail below.

Substituting Equations (28) and (29) into Equation (27) yields the final expression for the location of the $p^{OPi}$ as:

$$p^{OPi} = [(LSx-100)\cos(\theta) + (LSy-100)\sin(\theta) + x_c] s_1 + [(100-LSx)\sin(\theta) + (LSy-100)\cos(\theta) + y_c] s_2 \tag{30}$$

Breaking Equation (30) into vector components yields the two scalar equations, which are used as estimated transformation parameters, namely $$SEMx = (LSx - 100_x)\cos(\theta) + (LSy - 100_y)\sin(\theta) + x_c \tag{31}$$

$$SEMy = (100_x - LSx)\sin(\theta) + (LSy - 100_y)\cos(\theta) + y_c \tag{32}$$

Equations (31) and (32) require the determination of $\theta$ (the angle of rotation between the imaging device and the laser scanning reference frames), $x_c$ (the imaging device x-coordinate of the wafer center), and $Y_c$ (the imaging device y-coordinate of the wafer center). As shown in FIG. 4, in the preferred method the notch is oriented such that it is directly above the wafer center in the laser scanning coordinate system, shown as L. The angle of rotation $\theta$ denotes the angle of rotation of the wafer between coordinate system and because of its selected initial orientation in the laser scanning coordinate system, it can be measured by determining the angle of rotation of the notch point from the vertical position in the imaging device coordinate system. Accordingly, the angle of rotation $\theta$ can be determined knowing the imaging device coordinates of the wafer center, $x_c$ and $y_c$ (also denoted as $x_{center}$ and $y_{center}$), and the imaging device coordinates of the notch as shown in FIG. 5. Initially, the imaging device coordinates of the wafer center and the wafer notch are estimated, accordingly, the angle of rotation $\theta$ determined from them is also estimated. Specifically, the angle of rotation $\theta$ is given by the equation:

$$\theta = \tan^{-1}\left(\frac{x_{notch} - x_{center}}{y_{notch} - y_{center}}\right) \tag{33}$$

Once the estimated transformation parameters have been determined in Equations (31) and (32), in step 36 the coordinates of the particles on the wafer are transformed to estimated imaging device coordinates using the estimated transformation parameters.

In the preferred method, in the next step 38 two reference particles are located using the SEM based upon their estimated imaging device coordinates. After these two particles are located, their actual imaging device coordinates are determined. Once actual particles are located under the SEM however the actual transformation parameters (translation and rotation) can be determined by an inverse mapping of the coordinates of the found particles in the SEM coordinate frame to the coordinates of the identical particles in the laser scanning coordinate frame. The error between the estimated and actual coordinate transformation parameters can then also be determined.

Accordingly, in step 40 actual coordinate transformation parameters are determined based upon the actual imaging device coordinates and the laser scanning device coordinates of the two reference particles. Then, in step 42 the scanning device coordinates of the remaining particles on the wafer are transformed to imaging device coordinates using the actual transformation parameters.

Figure 6:
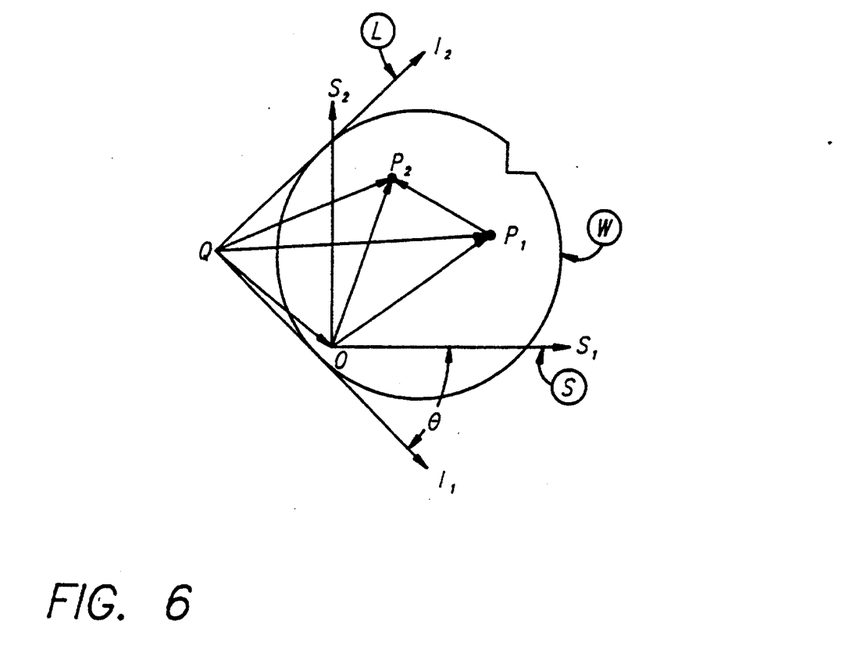
FIG. 6 is a diagrammatic view of a wafer showing the method for calculating the actual transformation parameters for a coordinate transformation between the laser scanning device and the SEM coordinate systems.

More particularly, after two particles are located using the SEM that correspond to two particles located using the laser scanning device, the actual transformation parameters between the scanning device and the imaging device are determined. Assuming two known particles P2 and P1 have been located, referring to FIG. 6, the following quantities are known:

$$p^{OP1} = SEMP1x\, s_1 + SEMP1y\, s_2 \tag{34}$$

$$p^{OP2} = SEMP2x\ s_1 + SEMP2y\ s_2 \tag{35}$$

$$p^{QP1} = LSP1x\ l_1 + LSP1y\ l_2 \tag{36}$$

$$p^{QP2} = LSP2x\ l_1 + LSP2y\ l_2 \tag{37}$$

To compute $\theta_{actual}$, the actual angle of rotation, Equation (34) is subtracted from Equation (35) and similarly Equation (36) is subtracted from Equation (37) to yield:

$$p^{P1P2} = (SEMP2x - SEMP1x)s_1 + (SEMP2y - SEMP1y)s_2 \tag{38}$$

$$p^{P1P2} = (LSP2x - LSP1x)l_1 + (LSP2y - LSP1y)l_2 \tag{39}$$

Equation (39) may be rewritten in terms of the SEM coordinate frame by substituting Equations (28) and (29), repeated here for convenience:

$$l_1 = \cos(\theta)s_1 - \sin(\theta)s_2 \tag{28}$$

$$l_2 = \sin(\theta)s_1 - \cos(\theta)s_2 \tag{29}$$

Thus Equation (39) may be rewritten as $$p^{P1P2}[(LSP2x-LSP1x)\cos\theta + [(LSP2y-LSP1y)\sin\theta]s_1 + [-(LSP2x-LSP1x)\sin\theta + [(LSP2y-LSP1y)\cos\theta]s_2 \tag{40}$$

Equating the vector components of Equations (38) and (40) yields two scalar equations $$(LSP2x-LSP1x)\cos\theta + (LSP2y-LSP1y)\sin\theta = (SEMP2x-SEMP1x) \tag{41}$$

$$-(LSP2x-LSP1x)\sin\theta + (LSP2y-LSP1y)\cos\theta = (SEMP2x-SEMP1x) \tag{42}$$

which may be solved simultaneously for $\theta$ to yield an actual angle of rotation in the form:

$$\theta_{actual} = \cos^{-1}\frac{[(LSP1y-LSP2y)(SEMP1y-SEMP2y)+(LSP1x-LSP2x)(SEMP1x-SEMP2x)]}{[(LSP1x-LSP2x)^2+(LSP1y-LSP2y)^2]} \tag{43}$$

In step 44 of FIG. 1c, the error in the estimated transformation parameters is determined. This error is a composite of the error in $\theta_{estimated}$, the estimated angle of rotation between the imaging device and the laser scanning reference frames, the error in $sc_{estimated}$, the wafer center estimated imaging device x-coordinate, and the error in $yc_{estimated}$, the wafer center estimated imaging device y-coordinate. By knowing $\theta_{actual}$, the error in the estimated angle of rotation, $\Delta\theta$, can be computed as $$\Delta\theta = \theta_{actual} - \theta_{estimated} \tag{44}$$

where $\theta_{actual}$ is given by Equation (43) and $\theta_{estimated}$ given by Equation (33). For additional accuracy in processing wafers, in step 46 the average error in the estimated transformation parameters for at least two wafers is determined. More particularly, $\Delta\theta$ is determined for each wafer and stored in a file which contains the $\Delta\theta$'s from the ten most recently processed wafers. As a new wafer is analyzed, in step 48 its $\theta_{estimated}$ is corrected with the average $\Delta\theta$ from the previous ten wafers: i.e.

$$\theta_{corrected} = \theta_{estimated} - \Delta\theta_{average} \tag{45}$$

It is this $\theta_{corrected}$ which is used to compute the estimated transformation parameters shown in Equations (31) and (32). Moreover, $xc_{actual}$ and $yc_{actual}$, the actual imaging device coordinates of the wafer center, can also be determined for use in Equations (31) and (32). $xc_{actual}$ and $yc_{actual}$ are determined by writing two equivalent expressions for $p^{QO}$ $$p^{QO} = LSP2x\ l_1 + LSP2y\ l_2 - SEMP2x\ s_1 - SEMP2y\ s_2 \tag{46}$$

$$p^{QO} = 100_x l_1 + 100_y l_2 - x_c s_1 - y_c s_2 \tag{47}$$

Using Equations (28) and (29) to express all coordinates in the SEM coordinate system and then equating vector components yields:

$$xc_{actual} = SEMP2x + (100_x - LSP2x)\cos\theta + (100_y - LSP2y)\sin\theta \tag{48}$$

$$yc_{actual} = SEMP2y + (LSP2x - 100_x)\sin\theta + (100_y - LSP2y)\cos\theta \tag{49}$$

Similar to the determination of $\Delta\theta$, the errors in the estimated wafer center coordinates, $\Delta x_c$ and $\Delta y_c$, can be computed once $sc_{actual}$ and $yc_{actual}$ are known, using the following equations:

$$\Delta xc = xc_{actual} - xc_{estimated} \tag{50}$$

$$\Delta yc = yc_{actual} - yc_{estimated} \tag{51}$$

where $xc_{actual}$ and $yc_{actual}$ are given by Equations (48) and (49) and $xc_{estimated}$ and $yc_{estimated}$ are given by Equations (19) and (20). $\Delta xc$ and $\Delta yc$ are computed for each wafer and stored in a file which contains the $\Delta xc$'s and $\Delta yc$'s for the ten most recently processed wafers. As a new wafer is analyzed, its $xc_{estimated}$ and $yc_{estimated}$ are corrected with the average $\Delta xc$ and $\Delta yc$ from the previous ten wafers; i.e.

$$xc_{corrected} = xc_{estimated} + \Delta xc_{average} \tag{52}$$

$$yc_{corrected} = yc_{estimated} + \Delta yc_{average} \tag{53}$$

Accordingly, it is the $xc_{corrected}$ and $yc_{corrected}$ which are used to compute the estimated transformation parameters in Equations (31) and (32), described above.

Finally, after the coordinates from the laser scanning device are transformed to actual coordinates in the imaging device, in step 50 the remaining particles are located using the imaging device and analyzed.

From the foregoing description, it should be apparent that the present invention provides a method for reducing targeting errors that arise when trying to locate contaminant particles on a notched wafer using a high-magnification imaging device. The present invention uses estimates of the positions of the wafer notch and the wafer center to determine estimated transformation parameters for a coordinate transformation between the coordinate systems of the scanning device and the imaging device. After actual particle coordinates are determined for two reference particles, actual transformation parameters are determined based upon the estimated and actual coordinates of the two particles.

Although the invention has been described in detail with reference to the presently preferred method, those of ordinary skill in the art will appreciate that various modifications can be made without departing from the invention. Accordingly, the invention is defined only by the following claims.

We claim:

1. A method for locating particles on a notched semiconductor wafer, the method comprising:
   (a) scanning a notched semiconductor wafer with a scanning device to obtain scanning device coordinates pertaining to the positions of: (i) the center of the wafer, (ii) the wafer notch, and (iii) contaminant particles on the wafer;
   (b) finding the wafer notch with an imaging device and obtaining its estimated imaging device coordinates;
   (c) finding the wafer center with an imaging device and obtaining its estimated imaging device coordinates;
   (d) calculating estimated transformation parameters for a coordinate transformation between the coordinate systems of the scanning device and the imaging device based on the scanning device coordinates and the estimated imaging device coordinates of the wafer notch and the wafer center; and
   (e) transforming the scanning device coordinates of the particles on the wafer to estimated imaging device coordinates using the estimated transformation parameters.

2. A method as defined in claim 1, wherein:
   the wafer notch is positioned in a laser scanning device specimen holder in predetermined orientation prior to scanning the wafer.

3. A method as defined in claim 2, wherein:
   the wafer notch is positioned in a laser scanning device specimen holder with the notch point at an angle of approximately 120 degrees from a predetermined axis prior to scanning the wafer.

4. A method as defined in claim 1, further comprising:
   loading the wafer on an image scanning device in a predetermined orientation.

5. A method as defined in claim 4, wherein the wafer is loaded on an image scanning device with the notch point at an angle of approximately 45 degrees from a predetermined axis.

6. A method as defined in claim 1, wherein the step of calculating estimated transformation parameters is also based upon an estimated angle of rotation determined from the scanning device coordinates and the estimated imaging device coordinates of the wafer notch and the wafer center.

7. A method as defined in claim 1, wherein the step of finding the wafer notch with an imaging device and obtaining its estimated imaging device coordinates includes:
   finding the imaging device coordinates of the intersection of two straight lines along the notch perimeter.

8. A method as defined in claim 1, wherein the step of finding the wafer notch with an imaging device and obtaining its estimated imaging device coordinates includes:
   locating points along the circumference of the notch and determining the imaging device coordinates of the center of the notch curvature using a least squares fit based upon the imaging device coordinates of the notch circumference points.

9. A method as defined in claim 8, wherein the number of points located along the circumference of the notch is four.

10. A method as defined in claim 1, wherein the step of finding the wafer notch with an imaging device and obtaining its estimated imaging device coordinates includes:
    finding the imaging device coordinates of the intersection of two straight lines along the notch perimeter;
    locating points along the circumference of the notch;
    determining the imaging device coordinates of the center of the notch curvature using a least squares fit based upon the coordinates of the notch circumference points; and
    averaging (i) the imaging device coordinates of the intersection of two straight lines along the notch perimeter, and (ii) the imaging device coordinates of the center of the notch curvature.

11. A method as defined in claim 1, wherein the step of finding the wafer center with an imaging device and obtaining its estimated imaging device coordinates includes:
    locating at least three points on the circumference of the wafer and determining the imaging device coordinates of the intersection of perpendicular bisectors of chords drawn between adjacent circumference points.

12. A method as defined in claim 1, wherein the step of finding the wafer center with an imaging device and obtaining its estimated imaging device coordinates includes:
    locating four points on the circumference of the wafer;
    for each unique combination of three points, determining the imaging device coordinates of the intersection of perpendicular bisectors of chords drawn between adjacent circumference points; and
    averaging the intersection imaging device coordinates determined for each unique combination of three points.

13. A method as defined in claim 1, wherein the step of finding the wafer center with an imaging device and obtaining its estimated imaging device coordinates includes:
    locating at least three points on the circumference of the wafer and determining the imaging device coordinates of the center of the points using a least squares fit based upon the coordinates of the circumference points.

14. A method as defined in claim 1, wherein the step finding the wafer center with an imaging device and obtaining its estimated imaging device coordinates includes:
    locating at least two points on the circumference of the wafer and determining the imaging device coordinates of the intersection of lines drawn perpendicular to tangents of the circumference points.

15. A method as defined in claim 1, wherein the step of finding the wafer center an the imaging device and obtaining its estimated imaging device coordinates includes:
    locating at least three points on the circumference of the wafer and determining the imaging device coordinates of the intersection of perpendicular bisectors of chords drawn between adjacent circumference points;
    locating at least three points on the circumference of the wafer and determining the imaging device coordinates of the center of the points using a least squares fit based upon the coordinates of the circumference points;

locating at least two points on the circumference of the wafer and determining the imaging device coordinates of the intersection of lines drawn perpendicular to tangents of the circumference points; and averaging the imaging device coordinates of the intersection of perpendicular bisectors of chords drawn between adjacent circumference points, the imaging device coordinates of the center of the points, and the imaging device coordinates of the intersection of lines drawn perpendicular to tangents of the circumference points.

16. A method as defined in claim 1, further comprising:

(f) finding at least two reference particles with an imaging device using their estimated imaging device coordinates and obtaining their actual imaging device coordinates;

(g) calculating actual transformation parameters for a coordinate transformation between the coordinate systems of the scanning device and the imaging device based on the scanning device coordinates and the actual imaging device coordinates of the reference particles; and (h) transforming the scanning device coordinates of the remaining particles on the wafer to imaging device coordinates using the actual transformation parameters.

17. A method as defined in claim 16, wherein the step of calculating actual transformation parameters includes inverse mapping the actual imaging device coordinates of the reference particles to the scanning device coordinates of the reference particles.

18. A method as defined in claim 16, wherein the step of calculating actual transformation parameters further includes:

determining an actual angle of rotation based on the scanning device coordinates of the reference particles and the actual imaging device coordinates of the reference particles;

determining actual imaging device coordinates of the wafer center based on the scanning device coordinates of the wafer center, the actual imaging device coordinates of the reference particles, and the actual angle of rotation; and using the actual angle of rotation and using the actual imaging device coordinates of the wafer center to determine the actual transformation parameters.

19. A method for locating particles on a notched semiconductor wafer, the method comprising:

(a) scanning a notched semiconductor wafer with a scanning device to obtain scanning device coordinates pertaining to the positions of: (i) the center of the wafer, (ii) the wafer notch, and (iii) contaminant particles on the wafer;

(b) finding the wafer notch with an imaging device and obtaining its estimated imaging device coordinates;

(c) finding the wafer center with an imaging device and obtaining its estimated imaging device coordinates;

(d) determining an estimated angle of rotation based on the estimated imaging device coordinates of the wafer notch and the wafer center;

(e) calculating estimated transformation parameters for a coordinate transformation between the coordinate systems of the scanning device and the imaging device based on the scanning device coordinates and the estimated imaging device coordinates of the wafer notch and the wafer center, and based on the estimated angle of rotation;

(f) transforming the scanning device coordinates of the particles on the wafer to estimated imaging device coordinates using the estimated transformation parameters;

(g) finding at least two reference particles with an imaging device using their estimated imaging device coordinates and obtaining their actual imaging device coordinates;

(h) determining an actual angle of rotation based on scanning device coordinates of the reference particles and the actual imaging device coordinates of the reference particles;

(i) determining actual imaging device coordinates of the wafer center based on the scanning device coordinates of the wafer center, the actual imaging device coordinates of the reference particles, and the actual angle of rotation;

(j) calculating actual transformation parameters for a coordinate transformation between the coordinate systems of the scanning device and the imaging device based on the actual angle of rotation and using the actual imaging device coordinates of the wafer center; and (k) transforming the scanning device coordinates of the remaining particles on the wafer to imaging device coordinates using the actual transformation parameters.

20. A method as defined in claim 19, further comprising:

repeating steps (a) through (k) to process additional wafers;

for each wafer, determining an error in the estimated angle of rotation based on the difference between the estimated angle of rotation and the actual angle of rotation;

for each wafer, determining an error in the estimated imaging device coordinates of the wafer center based on the difference between the estimated imaging device coordinates of the wafer center and the actual imaging device coordinates of the wafer center;

averaging the error in the estimated angle of rotation of the processed wafers to obtain an average rotation error;

averaging the error in the estimated imaging device coordinates of the wafer center of the processed wafers to obtain an average center error;

wherein each step (h) of determining an actual angle of rotation further includes correcting the actual angle of rotation using the average rotation error; and wherein each step (i) of determining actual imaging device coordinates of the wafer center further includes correcting the actual imaging device coordinates of the wafer center using the average center error.

21. A method for locating particles on a notched semiconductor wafer, the method comprising:

(a) scanning a notched semiconductor wafer with a scanning device to obtain scanning device coordinates pertaining to the positions of: (i) the center of the wafer, (ii) the wafer notch, and (iii) contaminant particles on the wafer;

(b) loading the wafer on an image scanning device in a predetermined orientation;

(c) finding the wafer notch with an imaging device;

(d) obtaining the wafer notch estimated imaging device coordinates by finding the imaging device coordinates of the intersection of two straight lines along the notch perimeter;

(e) determining the estimated imaging device coordinates of the wafer center by locating at least three points on the circumference of the wafer and determining the imaging device coordinates of the intersection of perpendicular bisectors of chords drawn between adjacent circumference points;

(f) calculating estimated transformation parameters for a coordinate transformation between the coordinate systems of the scanning device and the imaging device based on the scanning device coordinates and the estimated imaging device coordinates of the wafer notch and the wafer center;

(g) transforming the scanning device coordinates of the particles on the wafer to estimated imaging device coordinates using the estimated transformation parameters;

(h) finding at least two reference particles with an imaging device using their estimated imaging device coordinates and obtaining their actual imaging device coordinates;

(i) calculating actual transformation parameters for a coordinate transformation between the coordinate systems of the scanning device and the imaging device based on the scanning device coordinates and the actual imaging device coordinates of the reference particles; and (j) transforming the scanning device coordinates of the remaining particles on the wafer to imaging device coordinates using the actual transformation parameters.

* * * * *